United States Patent
Frey

(10) Patent No.: US 7,106,621 B2
(45) Date of Patent: Sep. 12, 2006

(54) RANDOM ACCESS MEMORY ARRAY WITH PARITY BIT STRUCTURE

(75) Inventor: Christophe Frey, Austin, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 186 days.

(21) Appl. No.: 10/880,980

(22) Filed: Jun. 30, 2004

(65) Prior Publication Data

US 2006/0002180 A1    Jan. 5, 2006

(51) Int. Cl.
G11C 11/00    (2006.01)

(52) U.S. Cl. .................... 365/158; 365/148; 365/149

(58) Field of Classification Search ............... 365/158, 365/148, 149
See application file for complete search history.

(56) References Cited

U.S. PATENT DOCUMENTS

| | | | |
|---|---|---|---|
| 5,029,141 A | 7/1991 | Yoshimoto et al. | |
| 5,274,597 A | 12/1993 | Ohbayashi et al. | |
| 5,287,304 A | 2/1994 | Harward et al. | |
| 6,335,890 B1 | 1/2002 | Reohr et al. | |
| 6,532,163 B1 | 3/2003 | Okazawa | |
| 6,594,191 B1 | 7/2003 | Lammers et al. | |
| 6,639,834 B1 | 10/2003 | Sunaga et al. | |
| 6,717,844 B1 | 4/2004 | Ohtani | |
| 6,778,429 B1 | 8/2004 | Lu et al. | |
| 6,778,434 B1 | 8/2004 | Tsuji | |
| 6,795,335 B1 | 9/2004 | Hidaka | |
| 6,829,162 B1 | 12/2004 | Hosotani | |
| 6,862,235 B1* | 3/2005 | Sakata et al. | 365/202 |
| 6,891,742 B1 | 5/2005 | Takano et al. | |
| 6,894,918 B1* | 5/2005 | Sharma et al. | 365/158 |
| 6,940,749 B1 | 9/2005 | Tsang | |
| 2002/0027803 A1 | 3/2002 | Matsui | |
| 2002/0064067 A1 | 5/2002 | Inui | |
| 2002/0080644 A1 | 6/2002 | Ito | |
| 2003/0026125 A1 | 2/2003 | Hidaka | |
| 2003/0058686 A1 | 3/2003 | Ooishi et al. | |
| 2004/0052105 A1 | 3/2004 | Fulkerson et al. | |
| 2004/0125643 A1 | 7/2004 | Kang et al. | |
| 2004/0208052 A1 | 10/2004 | Hidaka | |
| 2005/0180203 A1 | 8/2005 | Lin et al. | |
| 2005/0281080 A1 | 12/2005 | Dray et al. | |

FOREIGN PATENT DOCUMENTS

EP    1 320 104    6/2003

OTHER PUBLICATIONS

Nahas, "A 4Mb 0.μ m 1T1MTJ Toggle MRAM Memory," 2004 IEEE International Solid-State Circuits Conference, ISSCC 2004, Session 2, Non-Volatile Memory/2.3, 0-7803-8267-6, 2004.
U.S. Appl. No. 10/880981, filed Jun. 30, 2004.

(Continued)

Primary Examiner—Huan Hoang
(74) Attorney, Agent, or Firm—Lisa K. Jorgenson; Andre M. Szuwalski

(57) ABSTRACT

A random access memory array includes first random access memory elements arranged in a plurality of rows and columns for storing data words at a multiple memory locations. The memory array further includes second random access memory elements arranged in at least one additional column. Each second random access memory element is associated with a memory location to store a flag value indicative of whether the data word stored at that memory location is a true or complement version. The individual memory elements may comprise magnetic random access memory elements. Alternatively, the individual memory elements may comprise flash memory cells.

46 Claims, 2 Drawing Sheets

OTHER PUBLICATIONS

U.S. Appl. No. 10/881746, filed Jun. 30, 2004.
U.S. Appl. No. 10/881747, filed Jun. 30, 2004.
U.S. Appl. No. 11/152,033, filed Jun. 14, 2005.
U.S. Appl. No. 11/159,858, filed Jun. 23, 2005.
Patent Abstracts of Japan, vol. 2000, No. 03, and JP 11 354728, Canon, Inc.

* cited by examiner

RANDOM ACCESS MEMORY ARRAY WITH PARITY BIT STRUCTURE

BACKGROUND OF THE INVENTION

1. Technical Field of the Invention

The present invention relates to random access memories, and further to magnetic random access memory arrays, and more particularly to an array architecture which supports reduced write current needs for memory arrays.

2. Description of Related Art

A magnetic random access memory (MRAM) element typically has a structure that includes a first and second magnetic layers which are separated by a non-magnetic layer. A magnetic vector in one of the two magnetic layers is magnetically fixed or pinned, while the magnetic vector of the other of the two magnetic layers is not fixed and thus its magnetization direction is free to be controlled and switched. Information is written to and read from the element as a logic "1" or a logic "0" (i.e., one or the other of two possible logic states) by changing the direction of the non-fixed magnetization vector in the other of the two magnetic layers. The differences in magnetization vector direction cause resistance variations within the element which can be measured. For example, the shifting of the magnetization vector direction can represent two different resistances or potentials, which are then read by the memory circuit as either a logic "1" or a logic "0." The detection of these resistance or potential differences due to shifting magnetization vector direction allows information to be written to and read from the MRAM element.

Reference is now made to FIGS. 1A and 1B wherein there are shown schematic diagrams of conventional MRAM elements 10. Each element includes a bit line 12 and a word line 14. The memory storing structure of the element 10 is referred to as a "magnetic tunnel junction" 16 (MTJ) which is represented in the schematic by a variable resistance and is physically composed of the first and second magnetic layers and the separating non-magnetic layer discussed above.

With reference to FIG. 1A, one end of this resistance is connected to the bit line 12. The other end of the resistance is connected to a conduction terminal of an access transistor 18. The access transistor 18 in the illustrated element 10 is an n-channel FET with its source conduction terminal connected to ground and its drain conduction terminal connected to the other end of the resistance. The gate terminal of the access transistor 18 is connected to the word line 14.

With reference to FIG. 1B, one end of this resistance is connected to a reference voltage (for example, a ground reference). The other end of the resistance is connected to a conduction terminal of an access transistor 18. The access transistor 18 in the illustrated element 10 is an n-channel FET with its source conduction terminal connected to the bit line 12 and its drain conduction terminal connected to the other end of the resistance. The gate terminal of the access transistor 18 is connected to the word line 14.

In either of the embodiments of FIGS. 1A and 1B, a write digit line 20 (WDL) and a write bit line 22 (WBL) for the element 10 intersect at the magnetic tunnel junction 14. These lines 20 and 22 selectively carry currents and thus each selectively create a magnetic flux proximate to the magnetic tunnel junction 16. The magnetic fields induced by current flow in the lines 20 and 22 can be used to set the non-fixed direction of the magnetic vector within the magnetic tunnel junction 16. As discussed above, the setting of this direction affects the resistance of the magnetic tunnel junction 16. By selectively choosing the direction and magnitude of the current flow in the lines 20 and 22, one can program the magnetic tunnel junction 16, through its varying resistance, to store either one of two logic states: a logic "1" or a logic "0." It is recognized, however, that the current in both the lines 20 and 22 must be of a certain magnitude in order to effectively control the non-fixed direction of the magnetic vector within the magnetic tunnel junction 16. It is accordingly imperative that sufficient current be made available in both lines 20 and 22 in order to write information into the element 10.

Reference is now made to FIG. 2 wherein there is shown a block diagram of a conventional MRAM memory array 50. The array 50 includes a plurality of individual MRAM elements 10 (of any suitable type including either of those shown in FIGS. 1A and 1B) arranged in a N×M array format. Each row 52 of elements 10 in the array 50 includes a word line 14 and a write digit line 20. Each column 54 of elements 10 in the array 50 includes a bit line 12 and a write bit line 22. Selection of a write digit line 20 and write bit line 22, along with the application of appropriate currents thereto, results in the writing of an information bit to the element 10 in the array 50 where the selected write digit line and write bit line intersect. Selection of a bit line 12 and a word line 14 turns on the access transistor 18 located at the intersection of the selected bit line and word line, and causes a current to flow through the magnetic tunnel junction 16 resistance whose magnitude is dependent on the programmed non-fixed direction of the magnetic vector within the magnetic tunnel junction. A sense amplifier (not shown) that is connected to the selected bit line 12 measures the current flowing in the bit line, as affected by the current flowing through the magnetic tunnel junction 16 resistance, in order to "read" the logic state of the element 10.

The write digit lines 20 and write bit lines 22 which extend across the rows and columns, respectively, of the array 50 are metal lines having a certain resistance which depends generally speaking on their metallic composition and dimensions (primarily length). The MRAM array 50 is typically supplied with a certain voltage (for example, 5V or 3.3V) which is fixed. When additional elements 10 are added to rows and/or columns of the array 50, the resistance of the individual write digit lines 20 and write bit lines 22 also increases. Ohm's Law, however, teaches that with a fixed voltage and an increasing resistance there is a corresponding decrease in the amount of current capable of being carried by each metal line. This presents a problem because, as discussed above, a certain magnitude of current is required in the lines 20 and 22 in order write information into the element 10. Increases in line 20 and line 22 length to accommodate additional rows/columns may preclude the lines 20 and 22, at the fixed supply voltage, from being able to carry sufficient programming currents. Thus, for a given fixed voltage and given line 20/22 characteristics, there exists a maximum line length which is permitted within the array 50 in order to ensure successful writing to an element 10.

The issue of sufficient current for programming the element 10 becomes of even greater concern when writing an entire word (for example, eight bits) into a memory location within the array 50 comprised of a corresponding plurality of elements. This operation requires that sufficient current be available for supply not only to the write digit line associated with the selected memory location, but also for supply simultaneously to the eight write bit lines associated with the elements 10 for that memory location. The potential division of available current among these multiple lines 20/22 for the word writing operation further restricts and limits the permitted lengths of the individual lines. In a worst-case scenario, each of the elements 10 associated with a given memory location may have to be changed during a word (for example, eight bit) write, and thus the size of the array 50, in general, and the lengths of the lines 20/22, in particular, must be designed with this worst-case scenario in mind.

Several solutions have been proposed in the art to the foregoing line length limitation problem. One solution is to change the structure of the element 10, and perhaps also the technology used to fabricate it (for example, materials, layer deposition depth, and the like), so as to reduce the minimum current magnitude characteristic of the element 10. Experiments with alternative structures and/or fabrication techniques have not been successful. Another solution is to live with the line 20/22 length limitations and create larger sized memories by repeating sub-blocks formed of arrays 50 whose size is limited in the manner described above. This solution is not preferred as the overall area required for the memory unreasonably increases due to the need to repetitively include peripheral circuits (control logic, decoders, read/write circuits and the like) for each sub-block.

A need accordingly exists for a solution which would allow for increasing write digit line and/or write bit line length in an MRAM array without necessitating increases in supply voltage. Alternatively, a need exists for a solution which would allow for supply voltages to be decreased while continuing to maintain write digit line and write bit line length.

SUMMARY OF THE INVENTION

In accordance with one embodiment of the present invention, a random access memory array comprises a plurality of first random access memory elements arranged in a plurality of rows and columns for storing data words at a plurality of memory locations. The memory array further comprises a plurality of second random access memory elements arranged in at least one additional column, wherein one second random access memory element is associated with each memory location to store a flag value indicative of whether the data word stored at that memory location is a true or complement version. The individual memory elements may comprise magnetic random access memory elements. Alternatively, the individual memory elements may comprise flash memory cells.

The random access memory array may be used in a random access memory including write circuitry. The write circuitry operates to read a currently stored word at that memory location in the magnetic random access memory array for comparison to the data word to be written. A number of bits which would need to be changed to replace the currently stored word with the data word to be written is identified. If the number of bits is less than or equal to one-half a total number of bits in the stored word, then the data word is written to the memory location in the array. Alternatively, if the number of bits is more than one-half the total number of bits in the stored word, then the data word is logically inverted and written to the memory location in the array.

An embodiment of the present invention is a method for writing a data word to a memory location in a random access memory array. First, a currently stored word is read from that memory location in the random access memory array. The currently stored word is compared to the data word to be written so as to identify a number of bits which would need to be changed to replace the currently stored word with the data word to be written. If the number of bits is less than or equal to one-half a total number of bits in the stored word, then the data word is written to the memory location in the random access memory array. If the number of bits is more than one-half the total number of bits in the stored word, then the data word is logically inverted and written to the memory location in the random access memory array. A flag in the memory associated with the memory location is set each time the logically inverted version of the data word is written.

Yet another embodiment of the present invention is a memory that includes a memory array and a write logic circuit. The memory array includes a plurality of first random access memory elements arranged in a plurality of rows and columns for storing data words at a plurality of memory locations. The memory array further includes a plurality of second random access memory elements arranged in at least one additional column, wherein one second random access memory element is associated with each memory location to store a flag value indicative of whether the data word stored at that memory location is a true or logically inverted version. The write logic circuit includes a comparator to compare a currently stored word at a certain memory location to the data word to be written and identifying a number of bits which would need to be changed to replace the currently stored word with the data word to be written. The write logic circuit further includes an inverter to logically invert the data word if the number of bits is more than one-half the total number of bits in the stored word.

In an aspect of the invention, the write logic circuit operates to write the logically inverted data word to the first random access memory elements at the certain memory location if the number of bits is more than one-half the total number of bits in the stored word, or write the data word to the first random access memory elements at the certain memory location if the number of bits is less than or equal to one-half the total number of bits in the stored word.

In another aspect of the invention, the write logic circuit further operates to set the data flag in the second random access memory element associated with the certain memory location where the logically inverted data word is written.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1A:
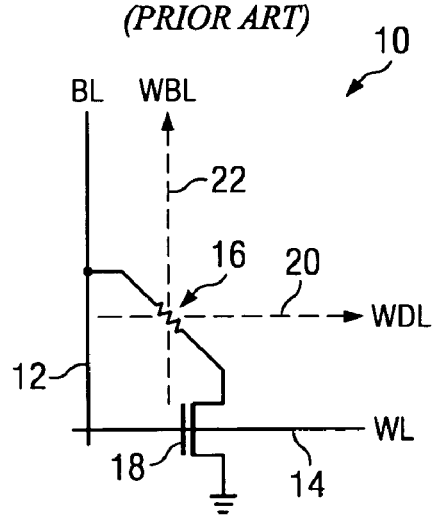
FIGS. 1A and 1B are schematic diagrams of prior art magnetic random access memory (MRAM) elements.
Figure 1B:
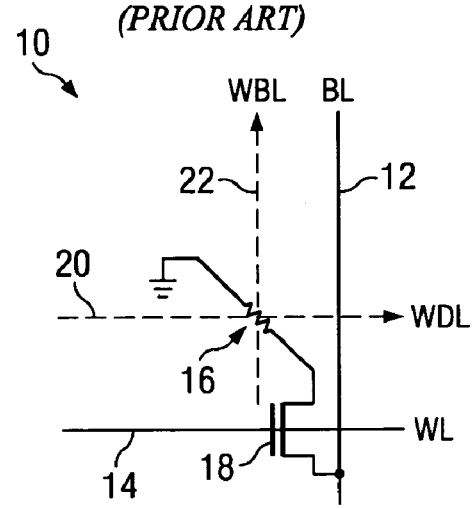
Figure 3:
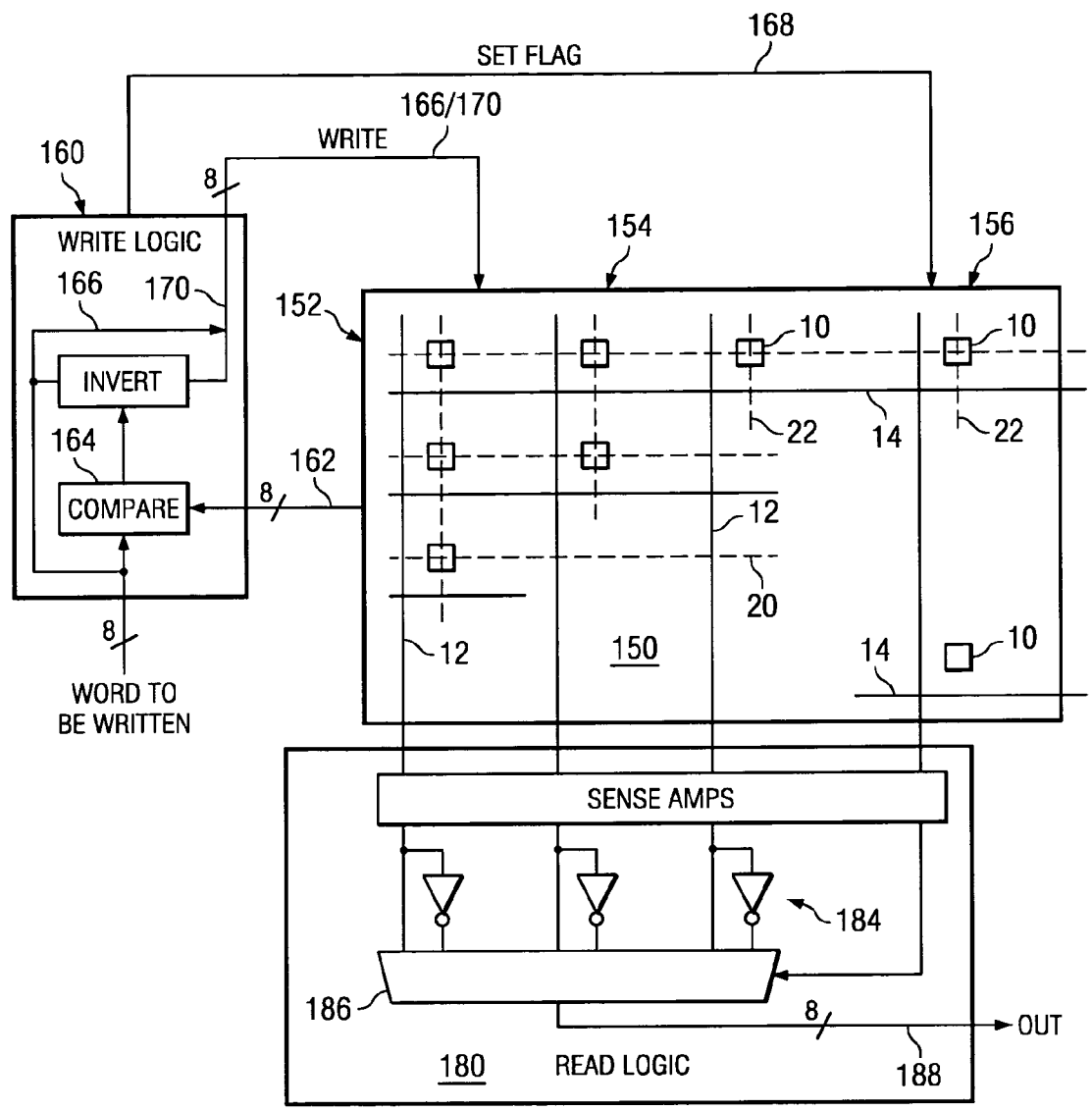
FIG. 3 is a block diagram of an MRAM memory array in accordance with an embodiment of the present invention.

Reference is now made to FIG. 3 wherein there is shown a block diagram of an MRAM memory array 150 in accordance with an embodiment of the present invention. The array 150 includes a plurality of individual MRAM elements 10 (of any suitable type including either of those shown in FIGS. 1A and 1B) arranged in a N×M array format. The array 150 includes a plurality of rows 152 and columns 154 populated with an individual element 10 located at each row/column intersection point. For a given plurality of columns 154, for example equal to eight in the case where eight bit words are being written to memory locations within the array 150, an additional parity column 156 is included in the array 150. It will be understood that more than the illustrated single additional parity column 156 may be included within the array 150, as needed. Each row 152 of elements 10 in the array 150 includes a word line 14 and a write digit line 20. Each column 154 and 156 of elements 10 in the array 150 includes a bit line 12 and a write bit line 22. Selection of a write digit line 20 and write bit line 22, along with the application of appropriate currents thereto, results in the writing of an information bit to the element 10 in the array 150 where the selected write digit line and write bit line intersect. Selection of a bit line 12 and a word line 14 turns on the access transistor 18 located at the intersection of the selected bit line and word line, and causes a current to flow through the magnetic tunnel junction 16 resistance whose magnitude is dependent on the programmed non-fixed direction of the magnetic vector within the magnetic tunnel junction. A sense amplifier (not shown) that is connected to the selected bit line 12 measures the current flowing in the bit line, as affected by the current flowing through the magnetic tunnel junction 16 resistance, in order to "read" the logic state of the element 10.

The memory array 150 further includes a write logic circuit 160. When a given memory location within the array 150 is being selected for a write operation, the write logic circuit 160 reads (arrow 162) the current contents of the elements 10 at the selected memory location and compares 164 those contents to the data that is going to be written to that memory location. This comparison determines how many of the elements 10 at the memory location will have to have their current logic state changed in order to store the data to be written. If the comparison reveals that one-half or fewer of the elements 10 will have to selected for writing the to be written word, the write logic circuit 160 causes the word to be written (arrow 166) to the memory location. If the comparison reveals that more than one-half of the elements 10 will have to selected for writing the to be written word, the write logic circuit 160 instead sets (arrow 168) a flag value (either logic "1" or logic "0" as desired) in the element 10 of the parity column 156 associated with the addressed memory location and causes a logically NOT (or inverted) version of the to be written word to be written (arrow 170) to the memory location. The set flag in the parity column provides an indication that the word stored in the addressed memory location is actually an inverted or complement version of the actual word.

The design and implementation of logic circuitry for implementing the processes and procedures described herein with respect to the write logic circuit 160 is well within the capabilities of one skilled in the art. It will further be understood that FIG. 3 has been simplified by omitting other peripheral control and operational circuitry, known to those skilled in the art, which is necessary for operation of a memory utilizing the array 150.

The foregoing operation of the write logic circuit 160 may be better understood through the examination of a few exemplary write operations.

Assume first that a given memory location within the array 150 currently stores the following word data: 11100011, and that the flag in the associated column 156 is not set (for example, it is logic "0"). Now assume that the word to be written to the given memory location is the following: 11110101. The comparison 164 operation performed by the write logic circuit 160 reveals that in order to write the word 11110101 to the given memory location which currently holds the word 11100011, then only the elements 10 (from the left) at the fourth, sixth and seventh locations within the given address need to be changed (i.e., xxx0x01x). Since only three elements need to be changed, and since three is less than or equal to one half of the total bits in the word, then the write logic circuit 160 controls the write 166 operation such that the write digit line for the given memory location and the write bit lines for the fourth, sixth and seventh element 10 locations within the word are selected. The other elements 10 are not selected and thus retain their prior logic values which correspond to the word to be written. Additionally, the write logic circuit 160 also selects the write digit line for the given memory location and the write bit lines for the parity column 156 so as to set 168 the flag value to logic "0", thus indicating that the memory location holds a true version of the stored word.

Now, again assume that a given memory location within the array 150 currently stores the following word data: 11100011, and that the flag in the associated column 156 is not set (for example, it is logic "0"). Now assume that the word to be written to the given memory location is the following: 01010100. The comparison 164 operation performed by the write logic circuit 160 reveals that in order to write the word 01010100 to the given memory location which currently holds the word 11100011, then the elements 10 (from the left) at the first, third, fourth, sixth, seventh and eighth locations within the given address need to be changed (i.e., 0x01x100). Since six elements need to be changed, and since six is more than one half of the total bits in the word, then the write logic circuit 160 chooses to instead write the inverted or complement word (i.e., 10101011) to the given memory location. Importantly, it will be recognized that in comparison to the currently stored word 11100011, the writing of the inverted version 10101011 of the word to be written would only require changing the logic state of two of the elements 10 at the given memory location (i.e., from the left, the second and fifth locations), and that this takes less current than writing to six elements. The write logic circuit 160 accordingly controls the write 170 operation such that the write digit line for the given memory location and the write bit lines for the second and fifth element 10 locations within the word and the location within the parity column (so as to set the flag to logic "1") are selected. Additionally, the write logic circuit 160 also selects the write digit line for the given memory location and the write bit lines for the parity column 156 so as to set 168 the flag value to logic "1", thus indicating that the memory location holds an inverted or complement version of the stored word.

Figure 2:
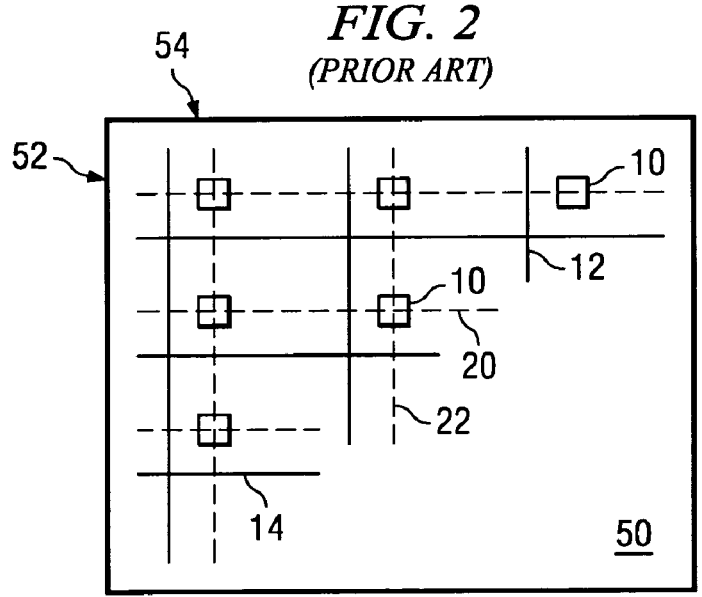
FIG. 2 is a block diagram of a conventional MRAM memory array.

With respect to these two examples, it will be recognized that the write logic circuit 160 functions to control the write 166/170 operation within the memory array 150 such that a minimal number of write logic changes need to be made to the elements 10 with each write operation. More particularly, the maximum number of individual element 10 write operations when writing a word to the given memory location will never exceed one-half of the total number of bits within the word. This is quite different from the prior art operation with respect to the array of FIG. 2 wherein writing a word to the given memory location could theoretically require in a worst-case scenario that the elements 10 for all eight bits in the word be written. In designing the array, the memory array designer in the prior art must take this worst case scenario into account when choosing line 20/22 lengths and array size. In the present situation, however, the memory array designer, with knowledge of the not more than one-half worst-case scenario for the memory array 150 of FIG. 3, can instead dimension the array (both in terms of write digit line length and write bit line length) to increase and optimize line lengths in view of the available current from a fixed voltage supply. Alternatively, the memory array designer can instead qualify an array with a given dimension to operate at a lower voltage supply.

The method of writing a data word to a memory location in a magnetic random access to the memory array 150 accordingly comprises first reading a currently stored word at that memory location in the magnetic random access memory array. The reading operation is accomplished by the memory, and perhaps by the write logic circuit 160 in particular, using conventional logic circuitry for providing a "read before write" operation. Next, the currently stored word is compared to the data word to be written and an identification is made of a number of bits which would need to be magnetically changed to replace the currently stored word with the data word to be written. The comparing and identifying operations are accomplished by the memory, and perhaps by the write logic circuit 160 in particular, using conventional logic circuitry for providing a bit-wise comparison between words and evaluation circuit for determining from the comparison a number of bits which would need to be changed to effectuate the replacement. Next, if the number of bits is less than or equal to one-half a total number of bits in the stored word, the data word is magnetically written to the memory location in the magnetic random access memory array. This operation is essentially identical to the conventional MRAM data write operation and thus utilizes conventional magnetic memory write circuitry. Alternatively, if the number of bits is more than one-half the total number of bits in the stored word, then the data word is logically inverted data word and then magnetically written to the memory location in the magnetic random access memory array. Bit-wise logic inverter circuitry is used to invert the data word and, as discussed above, the write operation is essentially identical to the conventional MRAM data write operation (except for the inverted word) and thus utilizes conventional magnetic memory write circuitry. Additionally, the method sets a flag in the memory array 150 if the inverted data word is being magnetically written to the memory location in the magnetic random access memory array, and clears the flag if the data word being written is a true version. As the flag is being maintained by a magnetic memory location 10, the process for setting and clearing the flag is essentially the same as setting the logic state of any other memory location 10 in the array and thus utilizes conventional magnetic memory write circuitry. In each case where one or more locations 10 need to be written to, the method selects the one or more memory elements in the magnetic random access memory array at or associated with the memory location which need to be changed, and then controls the corresponding write digit line and write bit line currents at each of those selected memory elements to write the appropriate data (i.e., bits of the data word or flag). The circuitry necessary for generating and applying currents to the write digit lines and write bit lines is well known to those skilled in the art.

Although the foregoing description focuses on an implementation regarding a magnetic random access memory, it will be recognized by those skilled in the art that the implementation is equally applicable to other memory technologies. For example, in an alternative embodiment, the array 150 comprises an array filled with elements 10 which each comprise flash memory cells of a construction well known to those skilled in the art. Such a flash memory could benefit from the comparison and true/complement word writing operations in accordance with embodiments of the present invention since this would reduce current draw and power needs within the flash memory. This controlled write operation would enhance flash memory operation in low power flash and perhaps multi-level flash applications.

In accordance with the write 166/170 operations performed with the memory array 150 in FIG. 3, it is possible for each given memory location to contain either a true version of the stored word or a complement (or inverted) version of the word (as specified by the elements 10 in the parity column(s) 156 which store the flag). This fact must be taken into account when subsequently reading the word from the given memory location.

The memory array 150 further includes a read logic circuit 180 which includes the sense amplifiers 182 (one per column 154 and 156) for discerning the logic state of each selected element 10 in the array 150. With respect to each of the data storing columns 154, an inverting logic circuit 184 is connected to the sense amplifier 182 so as to produce an inverted (or complement) bit in addition to the true bit output by the sense amplifier from reading the selected element 10. A multiplexer circuit 186 receives, for each column 154, both the true bit value (from the sense amplifier 182) and the complement bit value (from the inverting logic circuit 184). Selection between these two inputs by the multiplexer circuit 186 is made in accordance with the logic value read by the sense amplifier 182 for the element 10 in the parity column 156 which is associated with the read word. If the parity bit is a logic "0", indicating that the stored word at the memory location is a true version, then the multiplexer circuit 186 selects for output 188 each of the true bit value inputs for the read word. If, on the other hand, the parity bit is logic "1", indicating that the stored word at the memory location is an inverted or complement version, then the multiplexer circuit 186 selects for output 188 each of the complement bit value inputs for the read word, thus correcting for the previous inversion of the word which was performed by the write logic circuit 1609 when writing 170 the word data to the memory location.

The terms "connected" or "coupled" as used herein do not necessarily require a direct connection among and between the recited components. Rather, it will be appreciated by those skilled in the art that the Figures are illustrative and indirect connections or couplings through other components or devices is possible without detracting from the operation of the invention.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A method for writing a data word to a memory location in a magnetic random access memory array, comprising:
   reading a currently stored word at that memory location in the magnetic random access memory array;
   comparing the currently stored word to the data word to be written and identifying a number of bits which would need to be magnetically changed to replace the currently stored word with the data word to be written;
   if the number of bits is less than or equal to one-half a total number of bits in the stored word, then magnetically writing the data word to the memory location in the magnetic random access memory array; and if the number of bits is more than one-half the total number of bits in the stored word, then logically inverting data word and magnetically writing the inverted data word to the memory location in the magnetic random access memory array.

2. The method of claim 1 wherein magnetically writing the data word comprises:
selecting memory elements in the magnetic random access memory array at the memory location which need to be changed to replace the currently stored word with the data word to be written; and
controlling write digit line and write bit line currents at each of those selected memory elements to write bits of the data word.

3. The method of claim 1 wherein magnetically writing the inverted data word comprises:
selecting memory elements in the magnetic random access memory array at the memory location which need to be changed to replace the currently stored word with the inverted data word; and
controlling write digit line and write bit line currents at each of those selected memory elements to write bits of the inverted data word.

4. The method of claim 1 further comprising setting a flag if magnetically writing the inverted data word to the memory location in the magnetic random access memory array.

5. The method of claim 4 wherein setting the flag comprises:
selecting a parity memory element in the magnetic random access memory array which is associated with the memory location; and
controlling write digit line and write bit line currents at the selected parity memory element to write a logic state indicative of the flag being set.

6. A magnetic random access memory, comprising:
a magnetic random access memory array including a memory location to which a data word is to be written;
means for reading a currently stored word at that memory location in the magnetic random access memory array;
means for comparing the currently stored word to the data word to be written and identifying a number of bits which would need to be magnetically changed to replace the currently stored word with the data word to be written;
means for magnetically writing the data word to the memory location in the magnetic random access memory array if the number of bits is less than or equal to one-half a total number of bits in the stored word; and
means for logically inverting data word and magnetically writing the inverted data word to the memory location in the magnetic random access memory array if the number of bits is more than one-half the total number of bits in the stored word.

7. The memory of claim 6 wherein the means for magnetically writing the data word comprises:
means for selecting memory elements in the magnetic random access memory array at the memory location which need to be changed to replace the currently stored word with the data word to be written; and
means for controlling write digit line and write bit line currents at each of those selected memory elements to write bits of the data word.

8. The memory of claim 6 wherein the means for magnetically writing the inverted data word comprises:
means for selecting memory elements in the magnetic random access memory array at the memory location which need to be changed to replace the currently stored word with the inverted data word; and
means for controlling write digit line and write bit line currents at each of those selected memory elements to write bits of the inverted data word.

9. The memory of claim 6 further comprising means for setting a flag if magnetically writing the inverted data word to the memory location in the magnetic random access memory array.

10. The memory of claim 9 wherein the means for setting the flag comprises:
means for selecting a parity memory element in the magnetic random access memory array which is associated with the memory location; and
means for controlling write digit line and write bit line currents at the selected parity memory element to write a logic state indicative of the flag being set.

11. A magnetic random access memory array, comprising:
a plurality of first magnetic random access memory elements arranged in a plurality of rows and columns for storing data words at a plurality of memory locations; and
a plurality of second magnetic random access memory elements arranged in at least one additional column, wherein one second magnetic random access memory element is associated with each memory location to store a flag value indicative of whether the data word stored at that memory location is a true or complement version.

12. The array of claim 11 wherein each of the first and second magnetic random access memory elements, comprising:
a magnetic tunnel junction; and
a write bit line and a write data line associated with the magnetic tunnel junction and configured to control magnetic vector orientation with the magnetic tunnel junction so as to store information within the element.

13. The array of claim 12 wherein each of the first and second magnetic random access memory elements further comprises:
an access transistor connected between the magnetic tunnel junction and a bit line.

14. The element of claim 13 further comprising a word line connected to a gate terminal of the access transistor.

15. The array of claim 12 wherein each of the first and second magnetic random access memory elements further comprises:
an access transistor connected between one end of the magnetic tunnel junction and a reference voltage.

16. The element of claim 15 further comprising a word line connected to a gate terminal of the access transistor and a bit line connected to another end of the magnetic tunnel junction.

17. A random access memory array, comprising:
a plurality of first random access memory elements arranged in a plurality of rows and columns for storing data words at a plurality of memory locations; and
a plurality of second random access memory elements arranged in at least one additional column, wherein one second random access memory element is associated with each memory location to store a flag value indicative of whether the data word stored at that memory location is a true or complement version.

18. The array of claim 17 wherein each of the first and second random access memory elements is a magnetic random access memory element comprising:
- a magnetic tunnel junction; and
- a write bit line and a write data line associated with the magnetic tunnel junction and configured to control magnetic vector orientation with the magnetic tunnel junction so as to store information within the element.

19. The array of claim 18 wherein each of the first and second magnetic random access memory elements further comprises:
- an access transistor connected between the magnetic tunnel junction and a bit line.

20. The element of claim 19 further comprising a word line connected to a gate terminal of the access transistor.

21. The array of claim 18 wherein each of the first and second magnetic random access memory elements further comprises:
- an access transistor connected between one end of the magnetic tunnel junction and a reference voltage.

22. The array of claim 17 wherein each of the first and second random access memory elements is a flash memory cell.

23. A memory, comprising:
a memory array comprising:
- a plurality of first random access memory elements arranged in a plurality of rows and columns for storing data words at a plurality of memory locations; and
- a plurality of second random access memory elements arranged in at least one additional column, wherein one second random access memory element is associated with each memory location to store a flag value indicative of whether the data word stored at that memory location is a true or logically inverted version; and
a write logic circuit comprising:
- a comparator to compare a currently stored word at a certain memory location to the data word to be written and identifying a number of bits which would need to be changed to replace the currently stored word with the data word to be written; and
- an inverter to logically invert the data word if the number of bits is more than one-half the total number of bits in the stored word.

24. The memory of claim 23 wherein the write logic circuit operates to write the data word to the first random access memory elements at the certain memory location if the number of bits is less than or equal to one-half the total number of bits in the stored word.

25. The memory of claim 23 wherein the write logic circuit operates to write the logically inverted data word to the first random access memory elements at the certain memory location if the number of bits is more than one-half the total number of bits in the stored word.

26. The memory of claim 25 wherein the write logic circuit further operates to set the data flag in the second random access memory element associated with the certain memory location where the logically inverted data word is written.

27. The memory of claim 23 wherein each of the first and second random access memory elements is a flash memory cell.

28. The memory of claim 23 wherein each of the first and second random access memory elements is a magnetic random access memory element.

29. The memory of claim 23 further comprising:
a read logic circuit, comprising:
- a sense amplifier for each column in the array to output a value for data stored at selected ones of the first and second random access memory elements;
- an inverting circuit to generate a logically inverted value for the stored at the selected first random access memory elements; and
- a multi-bit multiplexer receiving the values and logically inverted values for the selected first random access memory elements and further receiving the value of the selected second random access memory element as a multiplex selection control signal to choose between the values and logically inverted values for read output.

30. A memory, comprising:
a memory array comprising:
- a plurality of first random access memory elements arranged in a plurality of rows and columns for storing data words at a plurality of memory locations; and
- a plurality of second random access memory elements arranged in at least one additional column, wherein one second random access memory element is associated with each memory location to store a flag value indicative of whether the data word stored at that memory location is a true or logically inverted version; and
a read logic circuit, comprising:
- a sense amplifier for each column in the array to output a value for data stored at selected ones of the first and second random access memory elements;
- an inverting circuit to generate a logically inverted value for the stored at the selected first random access memory elements; and
- a multi-bit multiplexer receiving the values and logically inverted values for the selected first random access memory elements and further receiving the value of the selected second random access memory element as a multiplex selection control signal to choose between the values and logically inverted values for read output.

31. The memory of claim 30 wherein each of the first and second random access memory elements is a flash memory cell.

32. The memory of claim 30 wherein each of the first and second random access memory elements is a magnetic random access memory element.

33. The memory of claim 30 further comprising:
a write logic circuit comprising:
- a comparator to compare a currently stored word at a certain memory location to the data word to be written and identifying a number of bits which would need to be changed to replace the currently stored word with the data word to be written; and
- an inverter to logically invert the data word if the number of bits is more than one-half the total number of bits in the stored word.

34. The memory of claim 33 wherein the write logic circuit operates to write the data word to the first random access memory elements at the certain memory location if the number of bits is less than or equal to one-half the total number of bits in the stored word.

35. The memory of claim 33 wherein the write logic circuit operates to write the logically inverted data word to the first random access memory elements at the certain memory location if the number of bits is more than one-half the total number of bits in the stored word.

36. The memory of claim 35 wherein the write logic circuit further operates to set the data flag in the second random access memory element associated with the certain memory location where the logically inverted data word is written.

37. A method for writing a data word to a memory location in a random access memory array, comprising:
   reading a currently stored word at that memory location in the random access memory array;
   comparing the currently stored word to the data word to be written and identifying a number of bits which would need to be changed to replace the currently stored word with the data word to be written;
   if the number of bits is less than or equal to one-half a total number of bits in the stored word, then writing the data word to the memory location in the random access memory array; and
   if the number of bits is more than one-half the total number of bits in the stored word, then logically inverting data word and writing the inverted data word to the memory location in the random access memory array.

38. The method of claim 37 wherein writing the data word comprises:
   selecting memory elements in the random access memory array at the memory location which need to be changed to replace the currently stored word with the data word to be written; and
   changing those selected memory elements to write bits of the data word.

39. The method of claim 37 wherein writing the inverted data word comprises:
   selecting memory elements in the random access memory array at the memory location which need to be changed to replace the currently stored word with the inverted data word; and
   changing those selected memory elements to write bits of the inverted data word.

40. The method of claim 37 further comprising setting a flag if writing the inverted data word to the memory location in the random access memory array.

41. The method of claim 40 wherein setting the flag comprises:
   selecting a parity memory element in the random access memory array which is associated with the memory location; and
   writing a logic state indicative of the flag being set to the parity memory element.

42. A random access memory, comprising:
   a random access memory array including a memory location to which a data word is to be written;
   means for reading a currently stored word at that memory location in the random access memory array;
   means for comparing the currently stored word to the data word to be written and identifying a number of bits which would need to be changed to replace the currently stored word with the data word to be written;
   means for writing the data word to the memory location in the random access memory array if the number of bits is less than or equal to one-half a total number of bits in the stored word; and
   means for logically inverting data word and writing the inverted data word to the memory location in the random access memory array if the number of bits is more than one-half the total number of bits in the stored word.

43. The memory of claim 42 wherein the means for writing the data word comprises:
   means for selecting memory elements in the random access memory array at the memory location which need to be changed to replace the currently stored word with the data word to be written; and
   means for changing those selected memory elements to write bits of the data word.

44. The memory of claim 42 wherein the means for writing the inverse data word comprises:
   means for selecting memory elements in the random access memory array at the memory location which need to be changed to replace the currently stored word with the inverted data word; and
   means for changing those selected memory elements to write bits of the inverse data word.

45. The memory of claim 42 further comprising means for setting a flag if writing the inverted data word to the memory location in the random access memory array.

46. The memory of claim 45 wherein the means for setting the flag comprises:
   means for selecting a parity memory element in the random access memory array which is associated with the memory location; and
   means for writing a logic state indicative of the flag being set to the parity memory element.

* * * * *